United States Patent [19]

Elliott, Jr.

[11] 4,227,124

[45] Oct. 7, 1980

[54] HIGH DUTY-CYCLE SWEEP GENERATOR FOR A CATHODE RAY OSCILLOSCOPE

[75] Inventor: Lloyd E. Elliott, Jr., Houston, Tex.

[73] Assignee: Texaco Inc., White Plains, N.Y.

[21] Appl. No.: 24,146

[22] Filed: Mar. 26, 1979

[51] Int. Cl.² .................... H01J 29/70; H01J 29/76
[52] U.S. Cl. .................................... 315/408; 328/36
[58] Field of Search ............ 315/408, 399, 403; 328/181, 36; 307/228

[56] References Cited

U.S. PATENT DOCUMENTS

| 3,255,363 | 6/1966 | Stella | 328/36 |
| 3,484,593 | 12/1969 | Schmoock et al. | 307/228 |
| 3,956,668 | 5/1976 | Ogawara | 315/408 |

Primary Examiner—Theodore M. Blum
Attorney, Agent, or Firm—Carl G. Ries; Robert A. Kulason; Henry C. Dearborn

[57] ABSTRACT

A sweep generator circuit for use with a cathode ray oscilloscope. It provides for a high duty-cycle by eliminating the discharge and recovery time of a conventional sweep generator circuit. This is accomplished by alternately charging and discharging the timing capacitor at equal rates, forming linear up and down ramp signals. Then, by amplifying the ramp signals along with synchronously reversing the polarity of the amplified down ramp signals, using electronic switching, identical unidirectional sweeps are produced during both charging and discharging times of the timing capacitor.

8 Claims, 2 Drawing Figures

HIGH DUTY-CYCLE SWEEP GENERATOR FOR A CATHODE RAY OSCILLOSCOPE

BACKGROUND OF THE INVENTION

1. Field of the Invention

This invention concerns a circuit for use with cathode ray oscilloscopes generally. More specifically it provides an improved sweep generator circuit.

2. Description of the Prior Art

In conventional cathode ray oscilloscopes, the frequency with which a sweep of given time length can be repeated is limited by the finite time required to discharge a timing capacitor and restore associated circuits to a stabilized state in which the application of trigger pulses may reliably initiate successive sweeps. In some applications, this limitation may have the effect of causing the display to appear to flicker or to have reduced apparent intensity because of reduced trace repetition. In other instances such as in using a dual channel scope, it may complicate the optimal display of successive events. Thus, if an event B immediately succeeds an event A in time, and a complete sweep is being used to display even A in its entirety, then the event B will occur during the discharge/stabilization period of a sweep and can only be displayed in its entirety by continuing to delay any sweep until B recurs.

Thus, it is an object of this invention to provide a circuit which substantially mitigates the foregoing difficulties. The invention provides a high duty-cycle sweep generator which substantially eliminates the time previously required for discharge of the timing capacitor and restoring circuits to stable conditions.

SUMMARY OF THE INVENTION

Briefly, the invention concerns a high duty-cycle sweep generator for a cathode ray oscilloscope. It comprises an integrator including a timer capacitor, and means for charging and discharging said timing capacitor at the same rate to provide linear ramp signals. It also comprises means for amplifying said linear ramp signals, and means for reversing the polarity of alternate ones of said amplified linear ramp signals without delay in order to provide a sweep signal which eliminates any recovery time for said timing capacitor.

Again briefly, the invention concerns a high duty cycle sweep generator for a cathode ray oscilloscope. It comprises an integrator including a timing capacitor, and first circuit means for supplying a positive voltage to said integrator. It also comprises second circuit means for supplying a negative voltage to said integrator, and first electronic switch means connected to said first circuit means for timing the application of said positive voltage to said integrator. It also comprises second electronic switch means connected to said second circuit means for timing the application of said negative voltage to said integrator, and a resistor connected to said timing capacitor for charging and discharging said capacitor at linear rates to provide linear ramp signals. It also comprises means for inverting and amplifying said ramp signals, and third circuit means including a third electronic switch and a unitary gain amplifier for selectively passing said inverted and amplified ramp signal. It also comprises fourth circuit means including a fourth electronic switch and a unitary gain inverting amplifier for selectively inverting and passing said inverted and amplified ramp signal, and a sweep signal circuit for alternately receiving said inverted-and-amplified and said reinverted-and-amplified ramp signals. Finally, it comprises fifth circuit means for alternatively actuating said third or said fourth electronic switches synchronously with said second or said first electronic switch means, respectively, to provide a sweep signal having zero recovery time for said timing capacitor.

BRIEF DESCRIPTION OF THE DRAWINGS

The foregoing and other objects and benefits of the invention will be more fully set forth below in connection with the best mode contemplated by the inventor of carrying out the invention, and in connection with which there are illustrations provided in the drawings, wherein.

DESCRIPTION OF THE PREFERRED EMBODIMENT

Figure 1:
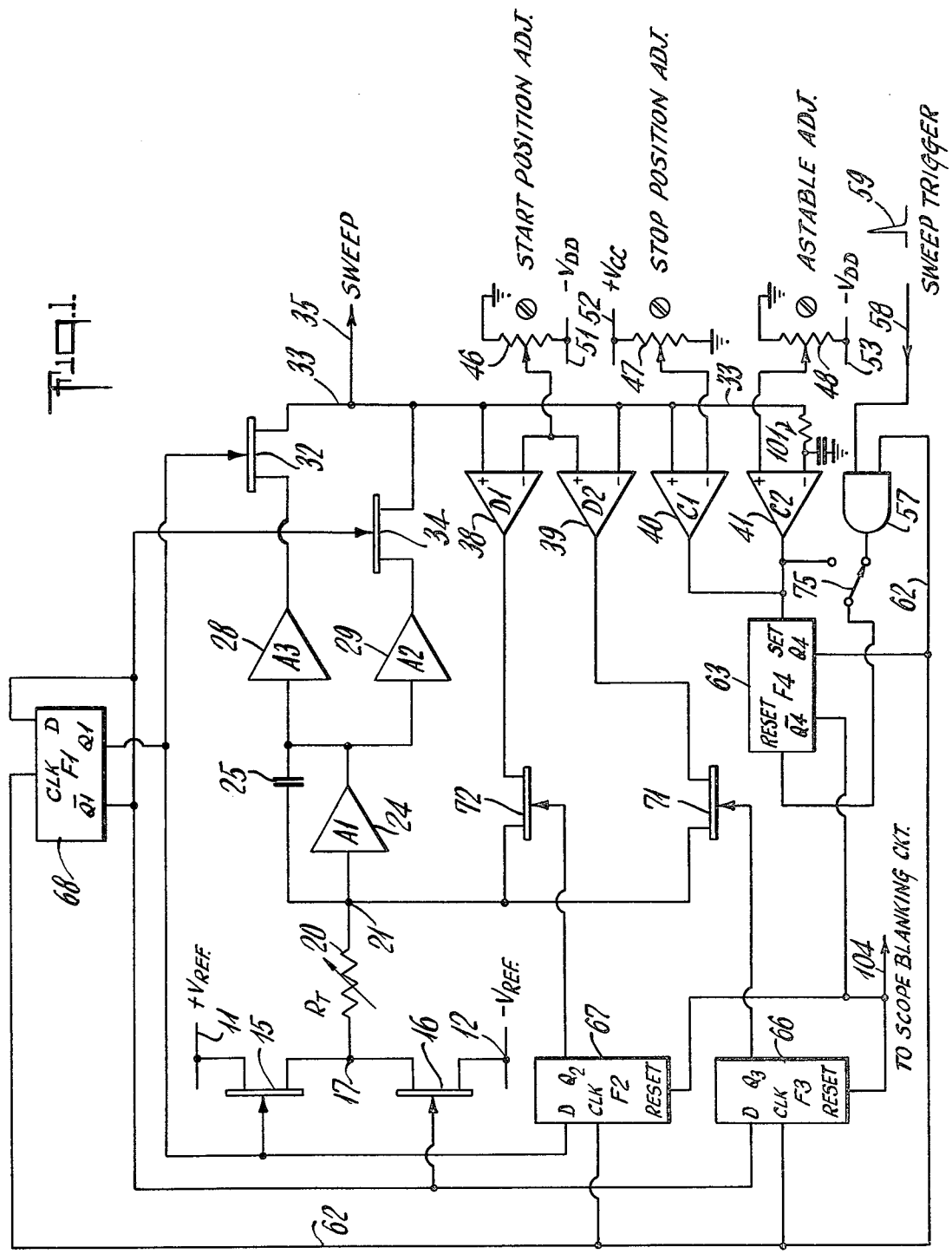
FIG. 1 is a schematic circuit diagram illustrating a high duty-cycle sweep generator circuit according to the invention.

Referring to FIG. 1, it will be understood by anyone skilled in the art that the various elements schematically indicated by rectangles and triangles are well known in the field of electronic circuit elements. Thus, the rectangles carrying the designations F1-F4 are flip-flops and, as well appear hereafter, they are the type designated as D type flip-flops. Similarly, the triangles designated A1, A2 and A3 are operational type amplifiers, and triangles designated D1 and D2 are differential amplifiers. Also, the triangles designated C1 and C2 are comparators, which are a known type of circuit element. Also, there is an AND gate illustrated which will be described in greater detail below.

It will be understood that the ground connections illustrated are at a neutral voltage. Such neutral is between a positive reference voltage that is connected to a circuit connection 11, and a negative reference voltage that is connected to a similar circuit connection 12. There is a pair of electronic switches 15 and 16 connected respectively between the positive circuit connection 11 and the negative circuit connection 12 to a circuit point 17, in between. It may be noted that the electronic switches 15 and 16 are the type of solid state electronic element known as field effect transistors. These act to conduct current when the control electrode has a high voltage thereon, and they are cut off (act as an open switch) when the control electrode has a low voltage applied.

There is a variable resistor 20 which is connected at one end to the circuit point 17, and at the other end to a circuit point 21. And, an amplifier 24 is connected across a timing capacitor 25. The input of the ampifier 24 is connected to the circuit point 27, and the output is connected to inputs of two other amplifiers 28 and 29.

The amplifier 24 has a predetermined amount of gain, and it is inverting as to the signal polarity. The amplifiers 28 and 29 have unitary gain in each case, but the amplifier 28 inverts the signals while amplifier 29 does not invert. Amplifiers 38 and 39 are identical differential amplifiers connected in such a way that amplifier 39 inverts output buss signals whereas amplifier 38 does not.

The output of amplifier 28 goes to one side of an electronic switch 32, which has the other side thereof connected to an output bus 33. The amplifier 29 has its output connected to one side of another electronic switch 34, and switch 34 has its other side connected to the same output bus 33. It will be noted that the output bus has an output connection 35 that carries the sweep signal to the sweep amplifier (not shown) of a cathode ray oscilloscope (not shown) or for some other use as may be desired.

The output bus 33 has additionally connected to it, one of the pair of inputs of each of the two differential amplifiers 38 and 39, and each of the two comparators 40 and 41. Also, there are three adjustable potentiometers 46, 47 and 48, which have the functions that are indicated by the captions applied to each.

It may be noted that the slider of potentiometer 46 is connected to the minus input of the differential amplifier 38, and also to the plus input of the differential amplifier 39. The slider of potentiometer 47 is connected to the minus input of the comparator 40 while the slider of the potentiometer 48 is connected to the plus input of the comparator 41.

The "START POSITION ADJUSTMENT" function of the potentiometer 46 covers the range of the potentiometer resistor which is connected between a circuit connection 51 and ground. The circuit connection 51 has the minus DD voltage of the electronic circuit connected to it. The "STOP POSITION ADJUSTMENT" potentiometer 47 has one end of its resistor connected to a circuit connection 52. Connection 52 has the plus CC voltage connected to it, while the other end of the resistor is connected to ground, as indicated. The "ASTABLE ADJUSTMENT" potentiometer 48 has one end of its resistor connected to a circuit connection 53. And, connection 53 like circuit connection 51 has the minus DD voltage applied thereto. The other end of the resistor of potentiometer 48 is connected to ground.

There is an AND gate 57 that has one input connected to a circuit connection 58. Connection 58 will have sweep trigger signals applied thereto, as in indicated by the caption and a trigger pulse symbol 59. The other input of AND gate 57 is connected via a circuit connection 62 that goes to the Q4 connection of a flip-flop 63 and also to the clocking circuit input connections of flip-flops 66, 67 and 68.

There are electronic switches 71 and 72 which like switches 15 and 16 are field effect transistors. The control electrodes of these switches 71 and 72 are connected to the Q3 circuit of flip-flop 66 and the Q2 circuit of flip-flop 67, respectively.

It may be noted that there is a selector switch 75 which is for alternatively selecting a triggered sweep mode (i.e. when connected as illustrated to the output of the AND gate 57), or an astable mode when it is switched to the other position.

It may also be noted that the flip-flops 66, 67 and 68 are D type flip-flops. However, the connections of the flip-flops 66 and 67 are such that they will not be switched upon receipt of a clocking pulse if the output of either is the same polarity as the D input, at clocking time. The flip-flop 68, on the other hand, is connected with its D input in common with its $\overline{Q}_1$, so that it will switch upon every receipt of a clocking pulse.

Also, it may be noted that the circuit which includes the switch 72 and differential amplifier 38, acts as a clamping circuit when it is completed by closing of the switch 72. This is so because it is a direct inverse feed back connection for the circuit of amplifier 24 when amplifier 29 is connected to the output bus 33 by switch 34. Similarly, the feedback clamping connection for the circuit of amplifier 24 may be completed by the switch 71 and the differential amplifier 39, when amplifier 28 is connected to the output bus 33 by switch 32.

Figure 2:
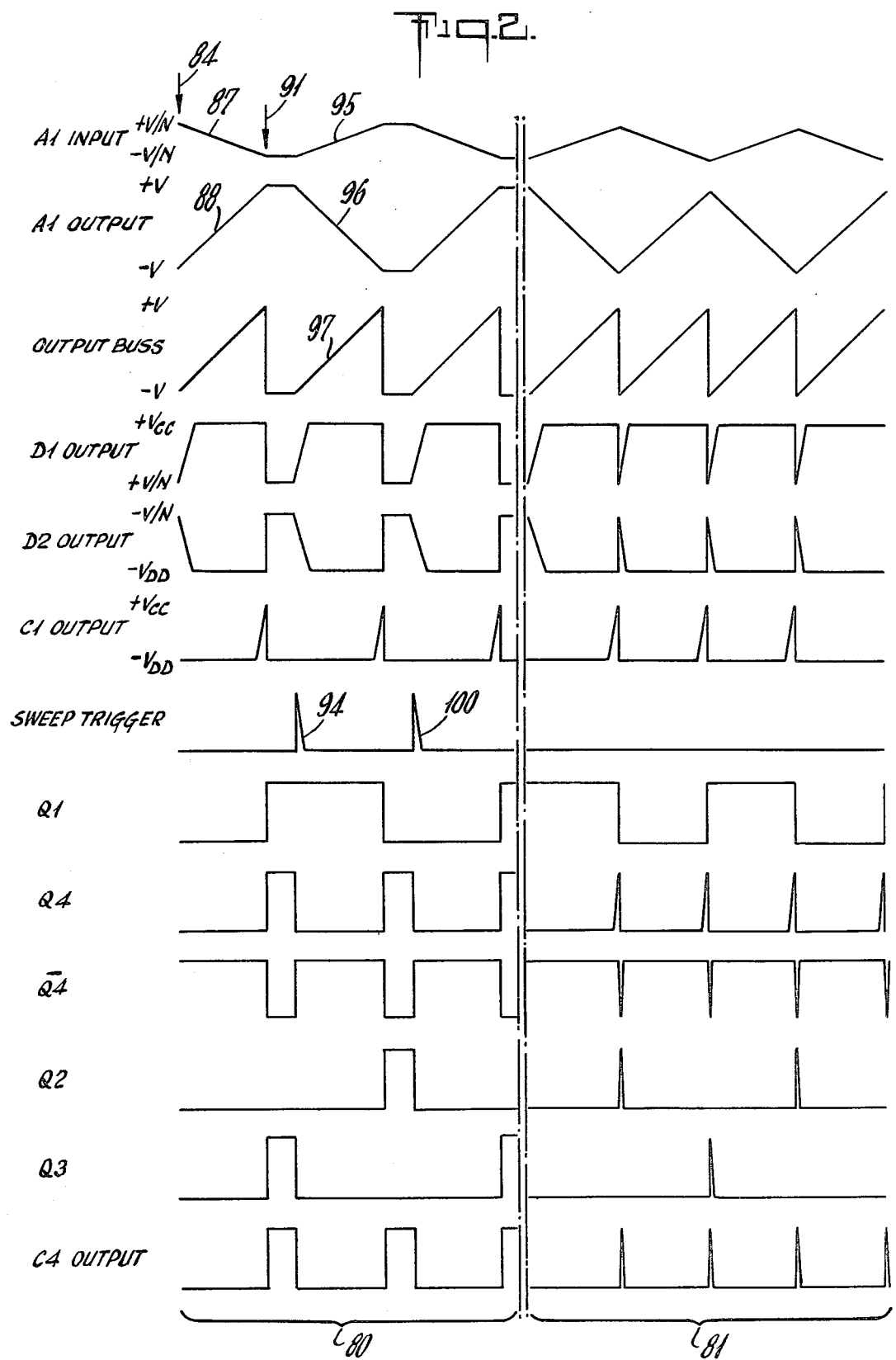
FIG. 2 is a timing diagram illustrating the wave forms of the signals at indicated locations in the circuit of FIG. 1.

It will be observed that FIG. 2 has two sections 80 and 81, which apply to a triggered sweep mode, or to an astable mode, respectively.

OPERATION

The operation may be described with reference to the FIG. 1 circuit diagram and the FIG. 2 timing diagram, as follows. Assuming that the $\overline{Q}_1$ is high, i.e. starting at a point 84 on section 80 of the timing diagram (indicated by an arrow on FIG. 2), the switches 34 and 16 will be closed while the remaining switches will be open. It will be noted that in describing these switches as closed and open, it is the circuit connecting and disconnecting switching effect that is being considered. And, these switches are electronic in nature being the type known as field effect transistors. They each act so that when the control electrode is at a particular plus voltage, the other two electrodes may freely pass current, while in the opposite state, i.e. when the control electrode goes negative, the other two electrodes are then non-conducting and thus the switch may be considered open.

At the beginning conditions indicated above, i.e. when $\overline{Q}_1$ is high, the input of the integrator (timing capacitor 25 and the variable resistor 20), will be connected via the resistor 20 to the negative reference voltage that exists on circuit connection 12, because the switch 16 is closed. This will cause a small down ramp 87 (see FIG. 2) to appear at the point 21 between the resistor 20 and the timing capacitor 25. At the same time a large up ramp 88 will appear at the output of the amplifier-inverter 24, and also at the output bus 33, via the unit gain amplifier 29 and the switch 34.

When the voltage on the output bus 33 equals the "stop position" voltage, at the input of comparator 40, that output will go high and will set the flip-flop 63. This makes Q4 of flip-flop 63 go high, and thus clocks the other three flip-flops 66, 67 and 68. Consequently, flip-flops 66 and 68 will change state, but flip-flop 67 will not because its output is the same polarity as its D input at clock time.

Then, with Q1 high and $\overline{Q}_1$ low the switches 32 and 15 will close, while the switches 34 and 16 will open. Also, Q3 will be high and so it will close switch 71. The closing of switch 71 completes a feedback loop which goes from the output bus 33 to the input point 21 of amplifier 24. These conditions are indicated on the timing diagram (section 80) by an arrow 91.

The output bus 33 is switched from plus voltage to minus voltage when the switches 34 and 16 are opened and the switches 32 and 15 are closed. The bus 33 is then clamped at this voltage by the action of the now closed inverse feedback loop. This feedback loop goes around amplifier 24 and amplifier 28 via the differential amplifier 39, and the switch 71. At the same time, Q4 being high enables the AND gate 57.

Next, the occurrence of a sweep trigger, e.g. a trigger pulse 94 which is illustrated in FIG. 2, will cause the flip-flop 63 to be reset. When $\overline{Q}_4$ goes high, the flip-flops 66 and 67 are reset so that the feedback clamping loop, just described, is opened and another sweep commences. This time, the resistor 20 is connected to the positive reference voltage at circuit connection 11, via the switch 15. And, a small up ramp 95 (FIG. 2) will appear at the input point 21 of the amplifier 24. A large down ramp 96 (FIG. 2) will appear at the output of amplifier 24, but this is inverted by the amplifier 28 so that another up ramp 97 (FIG. 2) appears at the output bus 23.

When the voltage on the output bus 33 again equals the stop position voltage at the input of comparator 40, the output of the comparator goes high setting the flip-flop 63. Q4 then goes high and clocks the three flip-flops 66, 67 and 68 once more. In this instance, flip-flops 68 and 67 change states, but flip-flop 66 does not change. Then, with $\overline{Q1}$ high and Q1 low, the switches 34 and 16 close, while Q2 of flip-flop 67 closes the switch 72 also.

The output bus 33 again switches from a plus voltage to a minus voltage, but is clamped at start position level by reason of the feedback loop now completed. This feedback loop is across the amplifiers 24 and 29, via the differential amplifier 38 and the switch 72. At this time, Q4 is again high, and the AND gate 57 is enabled so that another trigger pulse, e.g. a pulse 100 (FIG. 2) may initiate another sweep similar to that first described.

It will be readily understood by one skilled in the art that an astable operation (one not employing triggered sweeps), may be produced by deriving the flip-flop reset pulses from the flip-flop 63. The flip-flop 63 being reset from the output of comparator 41, rather than from the AND gate 57. Thus, the manual switch 75 would be switched over to connect comparator 41 to the reset circuit for flip-flop 63, in the alternative to the output of the AND gate 57. It may be noted that the comparator 41 produces a positive pulse each time the output bus 33 reaches start position voltage level. While it may be noted that the differential amplifier 39 also produces its output signal at the same time as comparator 41, the use of a separate comparitor 41 provides means for introducing a slight independent time delay that is produced by a resistor capacitor combination 101 which enhances the stabilization of the astable mode operation.

It also may be observed that there is a circuit connection 104 which carries the caption "To scope blanking circuit". It will be appreciated that this signal may be used for blanking the oscilloscope trace when the $\overline{Q4}$ is low. This occurs coextensively with the time when the signals are clamped when the feedback loops are closed.

It may be noted that the sweep generator circuit illustrated in FIG. 1, is basically one that employs a Miller integrator like that described in the book entitled "Pulse, Digital, and Switching Waveforms" by Jacob Millman and Herbert Taub, published by McGraw-Hill Inc. in 1965. See Sec. 14-9, pages 535–540.

Also, as indicated above, the switches 15, 16, 32, 34, 71 and 72 are field effect transistors and the flip-flops are D type. In addition, it will be understood by anyone skilled in the art that the desired functions may be derived using a variety of linear ramp generator circuits and/or other switches and logic devices.

While a particular embodiment of the invention in accordance with the applicable statutes has been described above in considerable detail, this is not to be taken as in any way limiting the invention, but merely as being descriptive thereof.

I claim:

1. High duty-cycle sweep generator for a cathode ray oscilloscope, comprising an integrator including a timing capacitor and means for charging and discharging said timing capacitor at the same rate to provide linear ramp signals, means for amplifying said linear ramp signals, and means for reversing the polarity of alternate ones of said amplified linear ramp signals without delay to provide a sweep signal which eliminates any recovery time for said timing capacitor.

2. High duty-cycle sweep generator according to claim 1, wherein said means for charging and discharging comprises electronic switch means and circuit means for connecting said timing capacitor alternately to a positive and a negative voltage source.

3. High duty-cycle sweep generator according to claim 2, wherein said means for reversing the polarity comprises means for inverting the output of said amplifying means and additional electronic switch means for connecting said inverted output alternately with said output uninverted to provide said sweep signal.

4. High duty-cycle sweep generator according to claim 3, also comprising means for alternatively selecting a triggered sweep mode or an astable mode, and means for clamping said sweep signal prior to the start of each sweep in said triggered sweep mode.

5. High duty-cycle sweep generator according to claim 4, also comprising means for providing a signal to control blanking of said oscilloscope when said sweep signal is clamped.

6. High duty-cycle sweep generator for a cathode ray oscilloscope, comprising an integrator including a timing capacitor, first circuit means for supplying a positive voltage to said integrator, second circuit means for supplying a negative voltage to said integrator, first electronic switch means connected to said first circuit means for timing the application of said positive voltage to said integrator, second electronic switch means connected to said second circuit means for timing the application of said negative voltage to said integrator, a resistor connected to said timing capacitor for charging and discharging said capacitor at linear rates to provide linear ramp signals, means for inverting and amplifying said ramp signals, third circuit means including a third electronic switch and a unitary gain amplifier for selectively passing said inverted and amplified ramp signal, fourth circuit means including a fourth electronic switch and a unitary gain inverting amplifier for selectively inverting and passing said inverted and amplified ramp signal, a sweep signal circuit for alternately receiving said inverted and amplified and said reinverted and amplified ramp signals, and fifth circuit means for alternatively actuating said third or said fourth electronic switches synchronously with said second or said first electronic switch means respectively to provide a sweep signal having zero recovery time for said timing capacitor.

7. High duty-cycle sweep generator according to claim 6, also comprising a switch and circuit means for alternatively selecting a triggered sweep mode or an astable mode, and circuit means for clamping said sweep signal prior to the receipt of each trigger pulse in said triggered sweep mode.

8. High duty-cycle sweep generator according to claim 7, also comprising
means for providing a signal to control blanking of said oscilloscope trace when said sweep signal is clamped.

* * * * *